United States Patent
Gong

(10) Patent No.: US 9,424,771 B2
(45) Date of Patent: Aug. 23, 2016

(54) UNIT PIXEL INCLUDING SUB-PIXELS ARRANGED IN A RHOMBUS SHAPE AND ORGANIC LIGHT EMITTING DISPLAY DEVICE HAVING THE SAME

(71) Applicant: SAMSUNG DISPLAY CO., LTD., Yongin, Gyeonggi-Do (KR)

(72) Inventor: Su-Cheol Gong, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 5 days.

(21) Appl. No.: 14/268,146

(22) Filed: May 2, 2014

(65) Prior Publication Data

US 2015/0015465 A1    Jan. 15, 2015

(30) Foreign Application Priority Data

Jul. 9, 2013  (KR) .................. 10-2013-0080374

(51) Int. Cl.
*G09G 3/32* (2016.01)
*H01L 27/32* (2006.01)

(52) U.S. Cl.
CPC .......... *G09G 3/3208* (2013.01); *H01L 27/3213* (2013.01); *H01L 27/3218* (2013.01); *G09G 2300/0452* (2013.01); *H01L 27/3216* (2013.01)

(58) Field of Classification Search
CPC ............. G09G 3/3208; H01L 27/3213; H01L 27/3216; H01L 27/3218; H01L 2300/0452
USPC ......................................................... 345/76
See application file for complete search history.

(56) References Cited

U.S. PATENT DOCUMENTS

| | | | |
|---|---|---|---|
| 2005/0041188 A1 | 2/2005 | Yamazaki | |
| 2005/0169551 A1* | 8/2005 | Messing et al. ............... | 382/260 |
| 2005/0225574 A1* | 10/2005 | Brown Elliott et al. ...... | 345/694 |
| 2007/0064020 A1* | 3/2007 | Credelle et al. ............... | 345/694 |
| 2007/0071352 A1* | 3/2007 | Brown Elliott et al. ...... | 382/261 |
| 2008/0252558 A1 | 10/2008 | Kim et al. | |
| 2009/0079351 A1* | 3/2009 | Choi et al. .................. | 315/169.3 |
| 2009/0109172 A1* | 4/2009 | Lee ........................ | G09G 3/344 345/107 |
| 2009/0135207 A1* | 5/2009 | Tseng et al. .................. | 345/690 |
| 2010/0026704 A1* | 2/2010 | Han et al. ...................... | 345/590 |
| 2010/0315319 A1 | 12/2010 | Cok et al. | |
| 2012/0049726 A1* | 3/2012 | Yoo et al. ...................... | 313/504 |
| 2012/0176428 A1 | 7/2012 | Credelle | |
| 2014/0145917 A1* | 5/2014 | Kwak .............................. | 345/82 |
| 2014/0198479 A1* | 7/2014 | Chao .................... | H01L 27/3218 362/84 |
| 2014/0231790 A1* | 8/2014 | Fujino ................... | H01L 27/322 257/40 |
| 2014/0306200 A1* | 10/2014 | Jinta .................... | H01L 27/3218 257/40 |

FOREIGN PATENT DOCUMENTS

| | | |
|---|---|---|
| KR | 10-2005-0019052 A | 2/2005 |
| KR | 10-2006-0000354 A | 1/2006 |
| KR | 10-2007-0018049 A | 2/2007 |
| KR | 10-2008-0093307 A | 10/2008 |
| KR | 10-2010-0113150 A | 10/2010 |

* cited by examiner

*Primary Examiner* — Joseph Feild
*Assistant Examiner* — Karin Kiyabu
(74) *Attorney, Agent, or Firm* — Lee & Morse, P.C.

(57) ABSTRACT

A unit pixel includes a first sub-pixel that emits a first color light, a second sub-pixel that emits a second color light, a third sub-pixel that emits a third color light, and a fourth sub-pixel that emits a fourth color light. Here, the first sub-pixel, the second sub-pixel, the third sub-pixel, and the fourth sub-pixel are arranged in a rhombus structure.

17 Claims, 7 Drawing Sheets

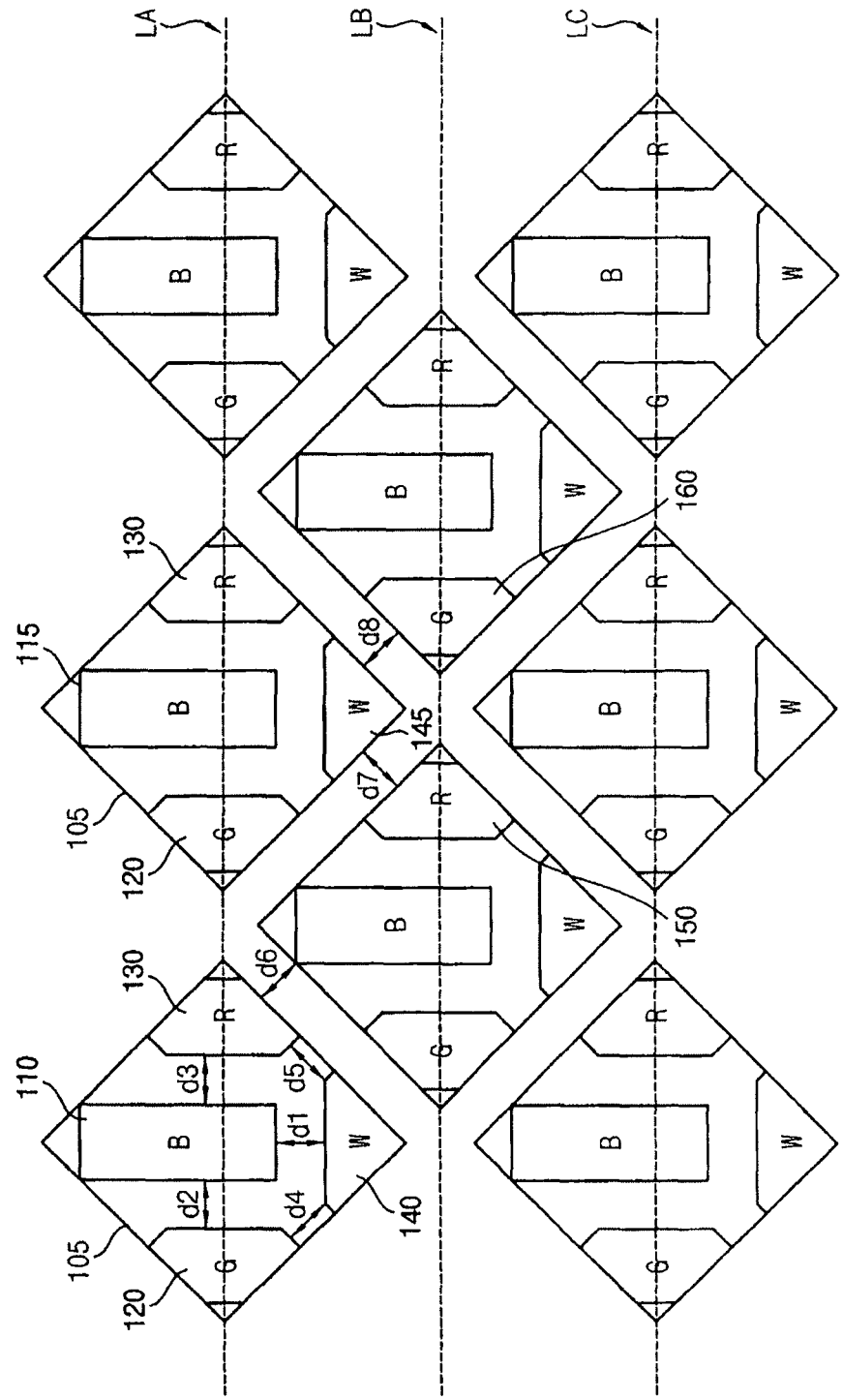

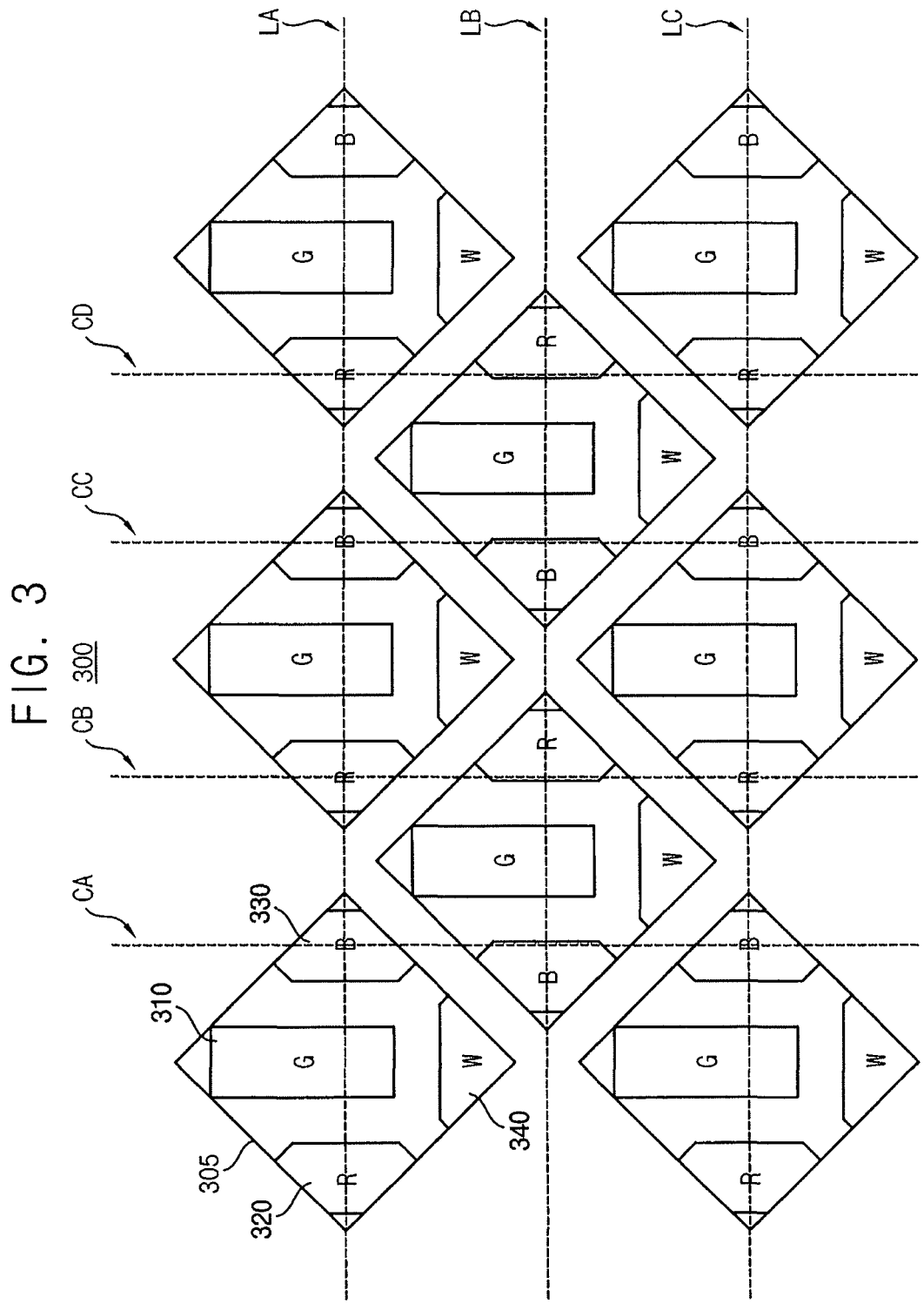

UNIT PIXEL INCLUDING SUB-PIXELS ARRANGED IN A RHOMBUS SHAPE AND ORGANIC LIGHT EMITTING DISPLAY DEVICE HAVING THE SAME

CROSS-REFERENCE TO RELATED APPLICATION

The present application claims priority under 35 U.S.C. §119 to Korean Patent Application No. 10-2013-0080374, filed on Jul. 9, 2013, in the Korean Intellectual Property Office, and entitled: "Unit Pixel and Organic Light Emitting Display Device Having The Same," which is incorporated by reference herein in its entirety.

BACKGROUND

1. Field

Example embodiments relate to a display device. More particularly, example embodiments relate to a unit pixel that implements a high resolution, and an organic light emitting display devices having the unit pixel.

2. Description of the Related Art

In general, a liquid crystal display (LCD) device, a plasma display panel (PDP) device, an organic light emitting display (OLED) device, and the like are widely used as a display device installed in an electronic device (e.g., a mobile device and the like). Because the OLED device has several advantages such as wide viewing angle, high response time, thinness, and low power consumption, the OLED device may be widely employed in various electronic devices. Recently, the OLED device has been rapidly developed as one of several promising display devices.

In general, three sub-pixels corresponding to a red (R) sub-pixel, a green (G) sub-pixel, and a blue (B) sub-pixel, or four sub-pixels corresponding to a red (R) sub-pixel, a green (G) sub-pixel, a blue (B) sub-pixel, and a white (W) sub-pixel may constitute one image pixel (i.e., a unit pixel). Thus, the unit pixel may emit various color lights by adjusting respective currents or respective voltages for the sub-pixels of the unit pixel, or by controlling respective turn-on times of the sub-pixels of the unit pixel.

However, the unit pixel of 3-color type including three sub-pixels (i.e., the red sub-pixel, the green sub-pixel, and the blue sub-pixel) has limits to adjust brightness and luminance. The unit pixel of 4-color type including four sub-pixels (i.e., the red sub-pixel, the green sub-pixel, the blue sub-pixel, and the white sub-pixel) involves an extra space for the white sub-pixel. Additionally, the unit pixel of 4-color type has structural limits by which distances between the white sub-pixel and other sub-pixels (i.e., the red sub-pixel, the green sub-pixel, and the blue sub-pixel) differs. The structural limits may result in resolution reduction.

SUMMARY

Embodiments are directed to a unit pixel, arrays thereof, and devices including the same.

Example embodiments provide a unit pixel having improved display ability (e.g., brightness, luminance, resolution, and the like) without any need for an increase in size of the unit pixel.

Example embodiments provide an organic light emitting display device including the unit pixel.

According to example embodiments, a unit pixel may include a first sub-pixel configured to emit a first color light, a second sub-pixel configured to emit a second color light, a third sub-pixel configured to emit a third color light, and a fourth sub-pixel configured to emit a fourth color light. Here, the first sub-pixel, the second sub-pixel, the third sub-pixel, and the fourth sub-pixel may be arranged in a rhombus structure.

In example embodiments, one side of the unit pixel may face one side of a neighboring unit pixel, the neighboring unit pixel being apart from the unit pixel.

In example embodiments, the first sub-pixel may have a square-shape or a vertically long rectangular-shape. In addition, the first sub-pixel may be arranged on a center part of the unit pixel.

In example embodiments, the second sub-pixel and the third sub-pixel may have a vertically long hexagonal-shape. In addition, the second sub-pixel and the third sub-pixel may be symmetrically arranged on a left side and a right side with respect to a center part of the first sub-pixel, respectively. Further, the first sub-pixel, the second sub-pixel, and the third sub-pixel may be apart from each other.

In example embodiments, the fourth sub-pixel may have a pentagonal-shape. In addition, the fourth sub-pixel may be arranged on a lower side of the first sub-pixel. Further, the fourth sub-pixel may be apart from the first sub-pixel, the second sub-pixel, and the third sub-pixel.

In example embodiments, the first color light, the second color light, and the third color light may correspond to one of a red color light, a green color light, and a blue color light, respectively.

In example embodiments, the fourth color light may correspond to a white color light.

In example embodiments, an area of the fourth sub-pixel may be between about 50% and about 100% of an area of the first sub-pixel.

In example embodiments, a distance between the first sub-pixel and the fourth sub-pixel may be substantially equal to a distance between the first sub-pixel and the second sub-pixel, and a distance between the first sub-pixel and the third sub-pixel.

In example embodiments, a distance between the first sub-pixel and the fourth sub-pixel may be substantially equal to a distance between the fourth sub-pixel and the second sub-pixel, and a distance between the fourth sub-pixel and the third sub-pixel.

In example embodiments, a distance between the first sub-pixel and the fourth sub-pixel may be substantially equal to a distance between the fourth sub-pixel and a third sub-pixel of a neighboring unit pixel that is arranged on a left side of the fourth sub-pixel, and a distance between the fourth sub-pixel and a second sub-pixel of a neighboring unit pixel that is arranged on a right side of the fourth sub-pixel.

According to example embodiments, an organic light emitting display device may include a display panel having a plurality of unit pixels, a scan driving unit, a data driving unit, and a timing control unit. Here, each of the unit pixels may include a first sub-pixel configured to emit a first color light, a second sub-pixel configured to emit a second color light, a third sub-pixel configured to emit a third color light, and a fourth sub-pixel configured to emit a fourth color light, wherein the first sub-pixel, the second sub-pixel, the third sub-pixel, and the fourth sub-pixel are arranged in a rhombus structure.

In example embodiments, one side of the unit pixel may face one side of a neighboring unit pixel, the neighboring unit pixel being apart from the unit pixel.

In example embodiments, the first sub-pixel may have a square-shape or a vertically long rectangular-shape. In addition, the first sub-pixel may be arranged on a center part of the unit pixel.

In example embodiments, the second sub-pixel and the third sub-pixel may have a vertically long hexagonal-shape. In addition, the second sub-pixel and the third sub-pixel may be symmetrically arranged on a left side and a right side with respect to a center part of the first sub-pixel, respectively. Further, the first sub-pixel, the second sub-pixel, and the third sub-pixel may be apart from each other.

In example embodiments, the fourth sub-pixel may have a pentagonal-shape. In addition, the fourth sub-pixel may be arranged on a lower side of the first sub-pixel. Further, the fourth sub-pixel may be apart from the first sub-pixel, the second sub-pixel, and the third sub-pixel.

In example embodiments, the first color light, the second color light, the third color light, and the fourth color light may correspond to one of a red color light, a green color light, a blue color light, and a white color light, respectively.

In example embodiments, the distance between the first sub-pixel and the fourth sub-pixel may be substantially equal to a distance between the first sub-pixel and the second sub-pixel, and a distance between the first sub-pixel and the third sub-pixel.

In example embodiments, a distance between the first sub-pixel and the fourth sub-pixel may be substantially equal to a distance between the fourth sub-pixel and the second sub-pixel, and a distance between the fourth sub-pixel and the third sub-pixel.

In example embodiments, a distance between the first sub-pixel and the fourth sub-pixel may be equal to a distance between the fourth sub-pixel and a third sub-pixel of a neighboring unit pixel that is arranged on a left side of the fourth sub-pixel, and a distance between the fourth sub-pixel and a second sub-pixel of a neighboring unit pixel that is arranged on a right side of the fourth sub-pixel.

Therefore, a unit pixel according to example embodiments may enable a high resolution of an organic light emitting display device without any increase of a size of the unit pixel by including a rhombus structure that has equal distances between sub-pixels emitting different color lights.

In addition, an organic light emitting display device having the unit pixel according to example embodiments may have improved display ability (i.e., color reproduction performance, brightness, and luminance) by providing equal distances between sub-pixels of the unit pixel. Thus, a plurality of unit pixels included in the organic light emitting display device is interactively driven. Further, the organic light emitting display device may display high-quality images, because the organic light emitting display device can improve color reproduction performance, brightness, and luminance by controlling luminance gray scale of a white color light emitted by a fourth sub-pixel (i.e., a white color sub-pixel).

BRIEF DESCRIPTION OF THE DRAWINGS

Features will become apparent to those of ordinary skill in the art by describing in detail exemplary embodiments with reference to the attached drawings in which:

Illustrative, non-limiting example embodiments will be more clearly understood from the following detailed description taken in conjunction with the accompanying drawings.

FIG. 1 is a diagram illustrating a unit pixel according to example embodiments.

FIG. 3 is a diagram illustrating a unit pixel according to example embodiments.

DETAILED DESCRIPTION

Figure 2A:
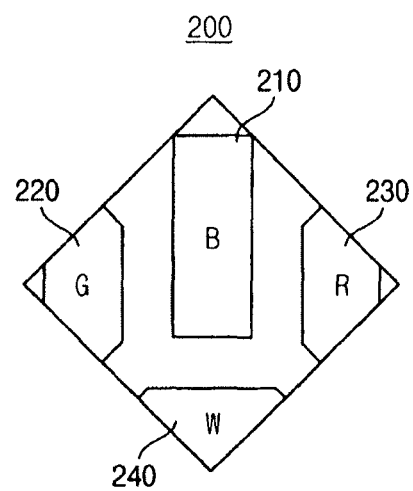
FIGS. 2A through 2C are diagrams illustrating examples in which a first sub-pixel, a second sub-pixel, a third sub-pixel, and a fourth sub-pixel are arranged in a unit pixel of FIG. 1.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third, and so on may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) of embodiments as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features of embodiments. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof of embodiments.

Example embodiments are described herein with reference to cross sectional illustrations that are schematic illustrations of illustratively idealized example embodiments (and intermediate structures) of the disclosure. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a diagram of an array 100 of unit pixels 105 according to example embodiments.

Referring to FIG. 1, the unit pixel 105 may have a rhombus structure. A plurality of unit pixels may be arranged on a substrate. In general, three sub-pixels corresponding to a red (R) sub-pixel, a green (G) sub-pixel, and a blue (B) sub-pixel, or four sub-pixels corresponding to a red (R) sub-pixel, a green (G) sub-pixel, a blue (B) sub-pixel, and a white (W) sub-pixel may constitute one image pixel (i.e., a unit pixel).

As illustrated in FIG. 1, the unit pixel 105 may include a first sub-pixel 110 that emits a first color light, a second sub-pixel 120 that emits a second color light, a third sub-pixel 130 that emits a third color light, and a fourth sub-pixel 140 that emits a fourth color light.

The unit pixel 105 may be arranged on the substrate. In example embodiments, one side of the unit pixel may face one side of a neighboring unit pixel, where the neighboring unit pixel is apart from the unit pixel. Compared to a rectangular-shaped unit pixel, the rhombus unit pixel 105 may provide substantially equal distances between the sub-pixels 110, 120, 130, and 140 that emit different color lights. Here, the respective distances between the sub-pixels 110, 120, 130, and 140 indicates respective shortest spaces between the sub-pixels 110, 120, 130, and 140. Thus, the rhombus unit pixel 105 may not require an extra space when the sub-pixels 110, 120, 130, and 140 are arranged in the rhombus unit pixel 105. That is, the sub-pixels 110, 120, 130, and 140 may be effectively arranged in the rhombus unit pixel 105.

Although the unit pixel 105 having the rhombus structure is illustrated as being orientated in a particular direction in FIG. 1, a shape and/or orientation of the unit pixel 105 is not limited thereto. For example, the unit pixel 105 may be any rhombus, i.e., an equilateral quadrilateral parallelogram. The unit pixel 105 having the rhombus structure and diamond-type orientation illustrated in FIG. 1 may be rotated any desired number of degrees to achieve any desired orientation, for example, rotated by 45 degrees to achieve a square-type orientation (see, for example, FIG. 4). Rotation may be about a central or any other type of axis.

In example embodiments, the first sub-pixel 110 may have a square-shape or a vertically long rectangular-shape. In addition, the first sub-pixel 110 may be arranged on a center part of the unit pixel 105. For example, as illustrated in FIG. 1, the first sub-pixel 110 may emit a blue color light.

In example embodiments, the second sub-pixel 120 and the third sub-pixel 130 may have a vertically long hexagonal-shape. The second sub-pixel 120 and the third sub-pixel 130 may be symmetrically arranged on a left side and a right side with respect to a center part of the first sub-pixel 110, respectively. Here, the first sub-pixel 110, the second sub-pixel 120, and the third sub-pixel 130 may be apart from each other. For example, as illustrated in FIG. 1, the second sub-pixel 120 may emit a green color light, and the third sub-pixel 130 may emit a red color light.

In example embodiments, the first color light, the second color light, and the third color light may correspond to one of a red color light, a green color light, and a blue color light, respectively. For example, as described above, the first color light may be the blue color light, the second color light may be the red color light, and the third color light may be the green color light. However, the first color light, the second color light, and the third color light are not limited thereto. For example, the first color light, the second color light, and the third color light may correspond to one of a yellow color light, a magenta color light, and a cyan color light, respectively. That is, the first color light, the second color light, and the third color light may correspond to three different color lights of which a combination results in a white color light.

In example embodiments, the fourth sub-pixel 140 may have a pentagonal-shape. In addition, the fourth sub-pixel 140 may be arranged on a lower side of the first sub-pixel 110 and may be apart from the first sub-pixel 110, the second sub-pixel 120, and the third sub-pixel 130. In example embodiments, the fourth color light emitted by the fourth sub-pixel 140 may correspond to the white color light. Luminance gray scale of the white color light emitted by the fourth sub-pixel 140 may be controlled by a driving integrated circuit of an organic light emitting display device. Therefore, the organic light emitting display device including the unit pixel 105 may adjust brightness and luminance of the emitted light. In example embodiments, the fourth sub-pixel 140 may be between about 50% and about 100% of an area of the first sub-pixel 110.

As described above, the first sub-pixel 110 may emit the first color light, the second sub-pixel 120 may emit the second color light, the third sub-pixel 130 may emit the third color light, and the fourth sub-pixel 140 may emit the fourth color light. Hence, the first sub-pixel 110, the second sub-pixel 120, the third sub-pixel 130, and the fourth sub-pixel 140 may include a first organic layer pattern for the first color light, a second organic layer pattern for the second color light, a third organic layer pattern for the third color light, and a fourth organic layer pattern for the fourth color light, respectively. Here, the first organic layer pattern, the second organic layer pattern, the third organic layer pattern, and the fourth organic layer pattern may be formed by a pattern masking process. For example, the pattern masking process may include a fine metal mask (FMM) process, a shadow mask process, and the like. However, the first organic layer pattern, the second organic layer pattern, the third organic layer pattern, and the fourth organic layer pattern may be formed by various processes. Meanwhile, the first organic layer pattern, the second organic layer pattern, the third organic layer pattern, and the fourth organic layer pattern may be independently formed so as to emit respective color lights. According to some example embodiments, the fourth organic layer pattern (i.e., for the white color light) may be formed by perpendicularly stacking up the first organic layer pattern (i.e., for the blue color light), the second organic layer pattern (i.e., for the red color light), and the third organic layer pattern (i.e., for the green color light). However, a way of forming the first organic layer pattern, the second organic layer pattern, the third organic layer pattern, and the fourth organic layer pattern is not limited thereto.

In example embodiments, a distance d1 between the first sub-pixel 110 and the fourth sub-pixel 140 may be substantially equal to a distance d2 between the first sub-pixel 110 and the second sub-pixel 120, and a distance d3 between the first sub-pixel 110 and the third sub-pixel 130. Further, the distance d1 between the first sub-pixel 110 and the fourth sub-pixel 140 may be substantially equal to a distance d4 between the fourth sub-pixel 140 and the second sub-pixel 120, and a distance d5 between the fourth sub-pixel 140 and the third sub-pixel 130.

Hereby, the unit pixel 105 may enable a high resolution of the organic light emitting display device, because the unit pixel 105 provides substantially equal distances between the sub-pixels 110, 120, 130, and 140 (i.e., the color lights emitted by the first sub-pixel 110, the second sub-pixel 120, the third sub-pixel 130, and the fourth sub-pixel 140 may be uniformly combined in the unit pixel 105). However, the relative distances d1, d2, d3, d4, and d5 are not required to be exactly equal to each other. For example, the distances d1, d2, d3, d4, and d5 may have a difference of about 10% from each other.

A display panel of the organic light emitting display device may include a structure in which a plurality of unit pixels is repetitively arranged. Here, as described above, the unit pixel 105 may have the rhombus structure. Specifically, one side of the unit pixel may face one side of a neighboring unit pixel, where the neighboring unit pixel is apart from the unit pixel. As illustrated in FIG. 1, a plurality of unit pixels may be collinearly arranged in a first row of the display panel (i.e., indicated as LA), a plurality of unit pixels may be collinearly arranged in a second row of the display panel (i.e., indicated as LB), and a plurality of unit pixels may be collinearly arranged in a third row of the display panel (i.e., indicated as LC). Here, a plurality of unit pixels are repetitively (i.e., contiguously) arranged on the display panel. As a result, two sub-pixels emitting the same color light may not be contiguous on the display panel. In example embodiments, a distance d6 between one side of the unit pixel and a faced side of the neighboring unit pixel may be substantially equal to a distance d1 between the first sub-pixel 110 and the fourth sub-pixel 140.

Thus, in example embodiments, a distance d1 between the first sub-pixel 110 and the fourth sub-pixel 140 may be substantially equal to a distance d7 between the fourth sub-pixel 145 and a third sub-pixel 150 of a neighboring unit pixel that is arranged on a left side of the fourth sub-pixel 145, and a distance d8 between the fourth sub-pixel 145 and a second sub-pixel 160 of a neighboring unit pixel that is arranged on a right side of the fourth sub-pixel 145. A first sub-pixel 115, the second sub-pixel 150, and the third sub-pixel 160 having substantially equal distances from the fourth sub-pixel 145 may emit different color lights. For example, the first sub-pixel 115 may emit the first color light (i.e., the blue color light), the third sub-pixel 150 of a neighboring unit pixel that is arranged on a left side of the fourth sub-pixel 145 may emit the third color light (i.e., the red color light), and the second sub-pixel 160 of a neighboring unit pixel that is arranged on a right side of the fourth sub-pixel 145 may emit the second color light (i.e., the green color light). However, the first color light, the second color light, and the third color light are not limited thereto. For example, the first color light, the second color light, and the third color light may correspond to one of a yellow color light, a magenta color light, and a cyan color light, respectively. That is, the first color light, the second color light, and the third color light may correspond to different three color lights of which a combination results in a white color light.

Thus, various color lights may be emitted by combining the white color light emitted by the fourth sub-pixel 145, the green color light emitted by the second sub-pixel 160 of a neighboring unit pixel, and the red color light emitted by the third sub-pixel 150 of a neighboring unit pixel.

Although it is described above that the unit pixel 105 is applied to the organic light emitting display device, the present disclosure is not limited thereto. For example, the unit pixel 105 may be applied to a liquid crystal display (LCD) device, an electroluminescence (EL) device, a plasma display panel (PDP) device, an iridescent display (ID) device, a light emitting diode (LED) device, an electrophoretic display device, and an incandescent display devices, and the like.

As described above, the unit pixel 105 having the rhombus structure may be arranged on the substrate. Additionally, the unit pixel 105 may include the first sub-pixel 110 emitting the first color light (i.e., the blue color light), the second sub-pixel 120 emitting the second color light (i.e., the green color light), the third sub-pixel 130 emitting the third color light (i.e., the red color light), and the fourth sub-pixel 140 emitting the fourth color light (i.e., the white color light). Here, the distance d1 between the fourth sub-pixel 140 and the first sub-pixel 110, the distance d4 between the fourth sub-pixel 140 and the second sub-pixel 120, and the distance d5 between the fourth sub-pixel 140 and the third sub-pixel 130 may be substantially equal to each other. Thus, the unit pixel 105 may enable a high resolution of the organic light emitting display device. (i.e., the color lights emitted by the first sub-pixel 110, the second sub-pixel 120, the third sub-pixel 130, and the fourth sub-pixel 140 may be uniformly combined in the unit pixel 105).

The distance d1 between the first sub-pixel 110 and the fourth sub-pixel 140 may be substantially equal to the distance d7 between the fourth sub-pixel 145 and the third sub-pixel 150 of the neighboring unit pixel that is arranged on the left side of the fourth sub-pixel 145, and the distance d8 between the fourth sub-pixel 145 and the second sub-pixel 160 of the neighboring unit pixel that is arranged on the right side of the fourth sub-pixel 145. Further, luminance gray scale of the white color light emitted by the fourth sub-pixel 145 may be controlled by a driving integrated circuit of an organic light emitting display device. Therefore, the organic light emitting display device may provide high-quality images. Thus, the organic light emitting display device including the unit pixels may have improved display ability (e.g., brightness, luminance, resolution, and the like).

Figure 2B:
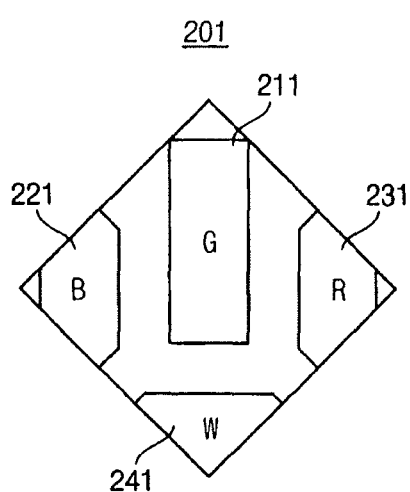
Figure 2C:
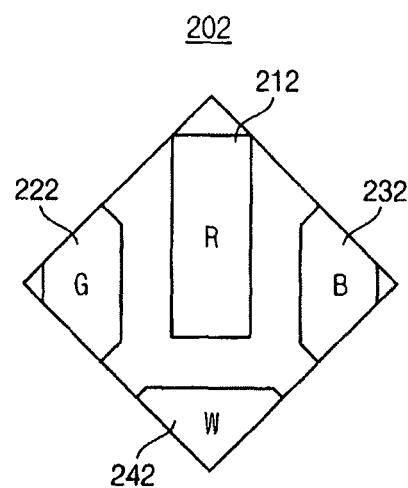

FIGS. 2A through 2C illustrate diagrams illustrating examples in which a first sub-pixel, a second sub-pixel, a third sub-pixel, and a fourth sub-pixel are arranged in a unit pixel of FIG. 1.

Referring to FIG. 2A though 2C, the unit pixel 200 may include a first sub-pixel 210 that emits a first color light (i.e., a blue color light), a second sub-pixel 220 that emits a second color light (i.e., a green color light), a third sub-pixel 230 that emits a third color light (i.e., a red color light), and a fourth sub-pixel 240 that emits a fourth color light (i.e., a white color light). The unit pixel 201 may include a first sub-pixel 211 that emits a first color light (i.e., a green color light), a second sub-pixel 221 that emits a second color light (i.e., a blue color light), a third sub-pixel 231 that emits a third color light (i.e., a red color light), and a fourth sub-pixel 241 that emits a fourth color light (i.e., a white color light). The unit pixel 202 may include a first sub-pixel 212 that emits a first color light (i.e., a red color light), a second sub-pixel 222 that emits a second color light (i.e., a green color light), a third sub-pixel 232 that emits a third color light (i.e., a blue color light), and a fourth sub-pixel 242 that emits a fourth color light (i.e., a white color light).

As illustrated in FIG. 2A, the first sub-pixel 210 may have a square-shape or a vertically long rectangular-shape, and the first sub-pixel 210 may be arranged on a center part of the unit pixel 200. The first sub-pixel 210 may emit the first color light (i.e., the blue color light).

The second sub-pixel 220 and the third sub-pixel 230 may have a vertically long hexagonal-shape. Here, the second sub-pixel 220 and the third sub-pixel 230 may be symmetrically arranged on a left side and a right side with respect to the center part of the first sub-pixel 210, respectively. In addition, the first sub-pixel 210, the second sub-pixel 220, and the third sub-pixel 230 may be apart from each other. The second sub-pixel 220 may emit the second color light (i.e., the green color light), and the third sub-pixel 230 may emit the third color light (i.e., the red color light).

The fourth sub-pixel 240 may have a pentagonal-shape. In addition, the fourth sub-pixel 240 may be arranged on a lower side of the first sub-pixel 210, and the fourth sub-pixel 240 may be apart from the first sub-pixel 210, the second sub-pixel 220, and the third sub-pixel 230. Further, the fourth sub-pixel 240 may emit the fourth color light (i.e., the white color light).

The first sub-pixel 210, the second sub-pixel 220, the third sub-pixel 230, and the fourth sub-pixel 240 may include a first organic layer pattern for the first color light (i.e., the blue color light), a second organic layer pattern for the second color light (i.e., the green color light), a third organic layer pattern for the third color light (i.e., the red color light), and a fourth organic layer pattern for the fourth color light (i.e., the white color light), respectively. Here, the first organic layer pattern, the second organic layer pattern, the third organic layer pattern, and the fourth organic layer pattern may be formed by a pattern masking process. For example, the pattern masking process may include a fine metal mask (FMM) process, a shadow mask process, and the like, for example, in a manner described herein.

As illustrated in FIG. 2B, the unit pixel 201 may include the first sub-pixel 211 that emits the first color light (i.e., the green color light), the second sub-pixel 221 that emits the second color light (i.e., the blue color light), the third sub-pixel 231 that emits the third color light (i.e., the red color light), and the fourth sub-pixel 241 that emits the fourth color light (i.e., the white color light). As illustrated in FIG. 2C, the unit pixel 202 may include the first sub-pixel 212 that emits the first color light (i.e., the red color light), the second sub-pixel 222 that emits the second color light (i.e., the green color light), the third sub-pixel 232 that emits the third color light (i.e., the blue color light), and the fourth sub-pixel 242 that emits the fourth color light (i.e., the white color light). In example embodiments, a display panel of the organic light emitting display device may include a structure in which a plurality of unit pixels 200, 201, and 202 are repetitively arranged.

As described above, the first color light, the second color light, and the third color light are not limited thereto. For example, the first color light, the second color light, and the third color light may correspond to one of a yellow color light, a magenta color light, and a cyan color light, respectively. That is, the first color light, the second color light, and the third color light may correspond to different three color lights of which a combination results in a white color light.

As illustrated in FIG. 2A though 2C, the distance between the fourth sub-pixel 240 and the first sub-pixel 210, the distance between the fourth sub-pixel 240 and the second sub-pixel 220, and the distance between the fourth sub-pixel 240 and the third sub-pixel 230 may be substantially equal to each other. The distance between the fourth sub-pixel 241 and the first sub-pixel 211, the distance between the fourth sub-pixel 241 and the second sub-pixel 221, and the distance between the fourth sub-pixel 241 and the third sub-pixel 231 may be substantially equal to each other. The distance between the fourth sub-pixel 242 and the first sub-pixel 212, the distance between the fourth sub-pixel 242 and the second sub-pixel 222, and the distance between the fourth sub-pixel 242 and the third sub-pixel 232 may be substantially equal to each other, for example, in a manner described herein.

FIG. 3 illustrates a diagram of an array 300 of unit pixels 305 according to example embodiments.

Referring to FIG. 3, the unit pixel 305 may have a rhombus structure. A plurality of unit pixels may be arranged on a substrate. In general, three sub-pixels corresponding to a red (R) sub-pixel, a green (G) sub-pixel, and a blue (B) sub-pixel, or four sub-pixels corresponding to a red (R) sub-pixel, a green (G) sub-pixel, a blue (B) sub-pixel, and a white (W) sub-pixel may constitute one image pixel (i.e., a unit pixel).

A distance between the first sub-pixel 310 and the fourth sub-pixel 340 may be substantially equal to a distance between the first sub-pixel 310 and the second sub-pixel 320, and a distance between the first sub-pixel 310 and the third sub-pixel 330. Further, the distance between the first sub-pixel 310 and the fourth sub-pixel 340 may be substantially equal to a distance between the fourth sub-pixel 340 and the second sub-pixel 320, and a distance between the fourth sub-pixel 340 and the third sub-pixel 330, for example, in a manner described herein.

Specifically, in the unit pixels arranged on the first low and the third row (i.e., indicated as LA and LC), second sub-pixels may emit red color light and third sub-pixels may emit blue color light. In the unit pixels arranged on the second low (i.e., indicated as LB), second sub-pixels may emit blue color light and third sub-pixels may emit red color light. That is, second sub-pixels and third sub-pixel may be alternatively arranged with respect to alter the rows. Specifically, a plurality of unit pixels may be collinearly arranged in a first row of the display panel (i.e., indicated as LA), a plurality of unit pixels may be collinearly arranged in a second row of the display panel (i.e., indicated as LB), and a plurality of unit pixels may be collinearly arranged in a third row of the display panel (i.e., indicated as LC). Second sub-pixels that arranged on the first row and the third row may emit a red color light, and third sub-pixels that arranged on the first row and the third row may emit a blue color light. On the other hand, Second sub-pixels that arranged on the second row may emit a blue color light, and third sub-pixels that arranged on the second row may emit a red color light. That is, as illustrated in FIG. 3, all of the sub-pixels arranged on a first column (i.e., indicated as CA) may emit the blue color light and all of the sub-pixels arranged on a second column (i.e., indicated as CB) may emit the red color light. Similarly, all of the sub-pixels arranged a third column (i.e., indicated as CC) may emit the blue color light and all of the sub-pixels arranged a fourth column (i.e., indicated as CD) may emit the red color light. Thus, masking process to the organic layers may be simplified, because the sub-pixels arranged on the same column (e.g., indicated as CA, CB, CC, and CD) emit the same color light.

Here, a plurality of unit pixels are repetitively (i.e., contiguously) arranged on the display panel. As a result, two sub-pixels emitting the same color light may not be contiguous on the display panel, for example, in a manner described herein.

Figure 4:
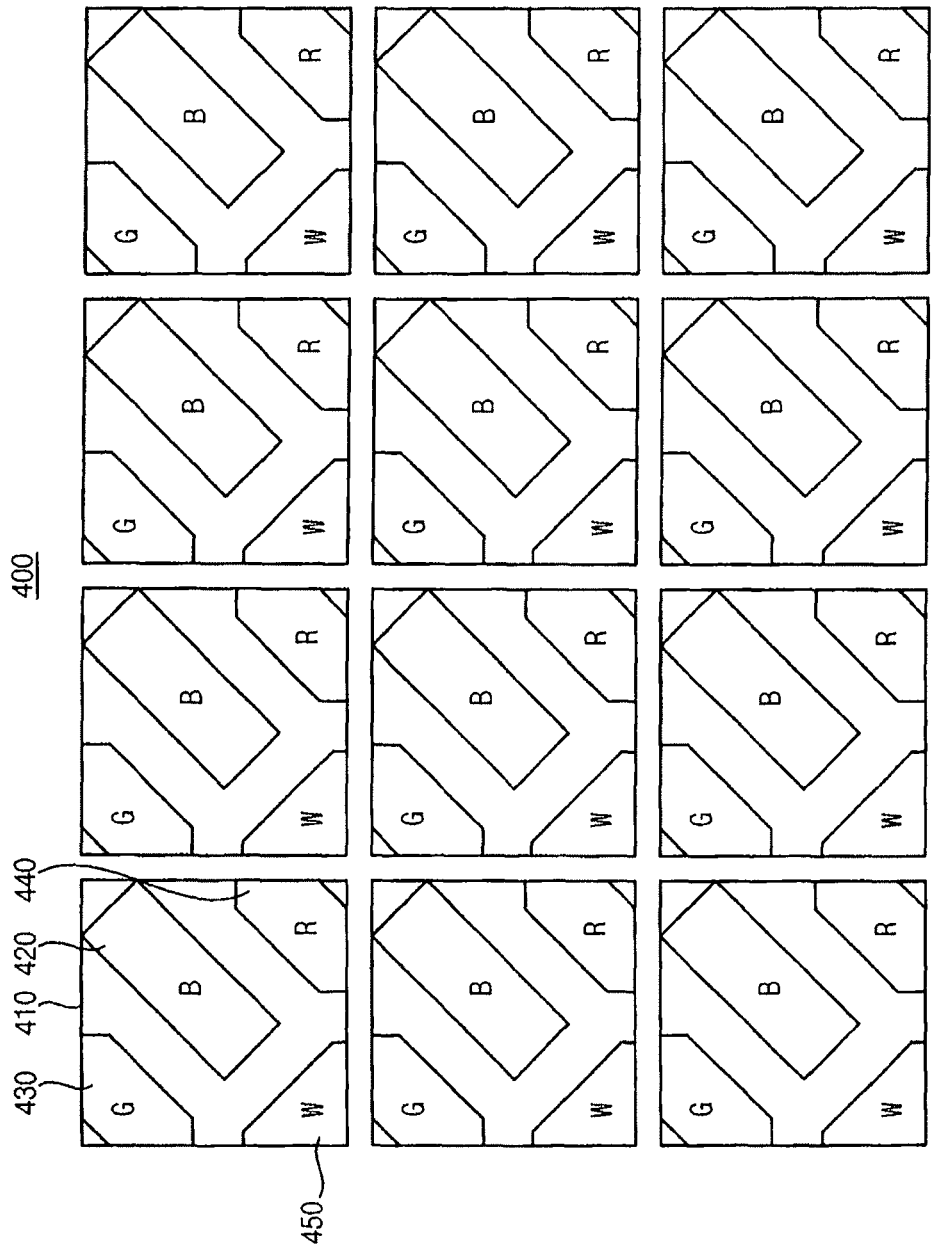
FIG. 4 is a diagram illustrating a unit pixel according to example embodiments.

FIG. 4 illustrates a diagram of an array 400 of unit pixels 410 according to example embodiments.

Referring to FIG. 4, a unit pixel 410 that is arranged on a substrate may have a rhombus structure having a square-type orientation. Four sub-pixels corresponding to a red (R) sub-pixel, a green (G) sub-pixel, a blue (B) sub-pixel, and a white (W) sub-pixel may constitute one image pixel (i.e., a unit pixel).

The unit pixel 410 may correspond to rotate 45 degrees of the rhombus unit pixel 105 illustrate in FIG. 1. Thus, forms and arrangement of a first sub-pixel, a second sub-pixel, a third sub-pixel, and a fourth sub-pixel 420, 430, 440, and 440 may correspond to the sub-pixels of the FIG. 1, for example, in a manner described herein.

Specifically, the unit pixel 410 may include the first sub-pixel 420 that emits a first color light (i.e., a blue color light), the second sub-pixel 430 that emits a second color light (i.e., a green color light), the third sub-pixel 440 that emits a third color light (i.e., a red color light), and the fourth sub-pixel 450 that emits a fourth color light (i.e., the white color light). A distance between the first sub-pixel 420 and the second sub-pixel 430 may be substantially equal to a distance between the first sub-pixel 420 and the third sub-pixel 440.

The fourth sub-pixel may emit a white color light. A distance between the first sub-pixel 420 and the fourth sub-pixel 450 may be substantially equal to a distance between the fourth sub-pixel 450 and the second sub-pixel 430, and a distance between the fourth sub-pixel 450 and the third sub-pixel 440. Hereby, the unit pixel 410 may enable a high resolution of the organic light emitting display device because the unit pixel 410 provides substantially equal distances between the sub-pixels 420, 430, 440, and 450 (i.e., the color lights emitted by the first sub-pixel 420, the second sub-pixel 430, the third sub-pixel 440, and the fourth sub-pixel 450 may be uniformly combined in the unit pixel 410).

Figure 5:
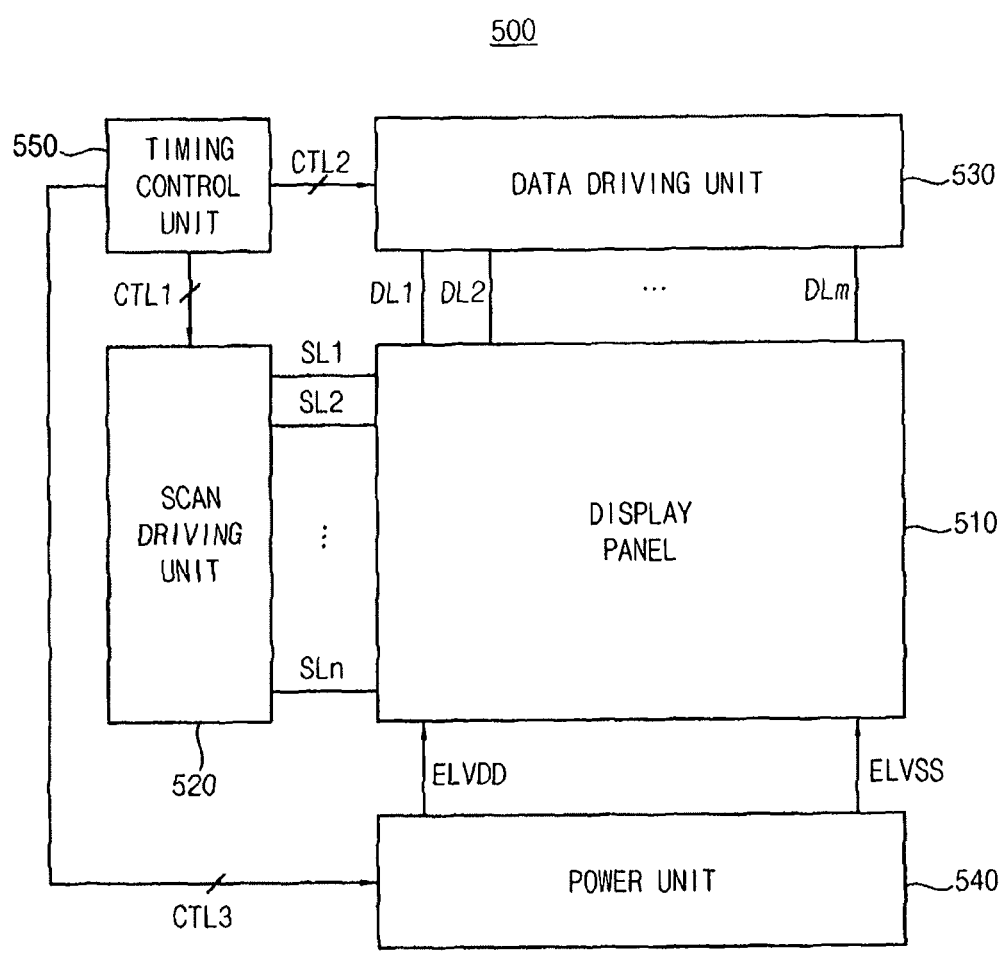
FIG. 5 is a block diagram illustrating an organic light emitting display device according to example embodiments.

FIG. 5 illustrates a block diagram of an organic light emitting display device according to example embodiments.

Referring to FIG. 5, the organic light emitting display device 500 may include a display panel 510, a scan driving unit 520, a data driving unit 530, a power unit 540, and a timing control unit 550.

The display panel 510 may include a plurality of unit pixels 105 including pixel circuits. The scan driving unit 520 may provide a scan signal to the pixel circuits through a plurality of scan-lines SL1, . . . , SLn. The data driving unit 530 may provide a data signal to the pixel circuits through a plurality of data-lines DL1, . . . , DLm. The power unit 540 may generate a high-power voltage ELVDD and a low-power voltage ELVSS, and may provide the high-power voltage ELVDD and the low-power voltage ELVSS to the pixel circuits through a plurality of power-lines. The timing control unit 550 may control the scan driving unit 520, the data driving unit 530, and the power unit 540. The timing control unit 550 may generate a plurality of control signals CTL1, CTL2, CTL3, and may provide the control signals CTL1, CTL2, CTL3 to the scan driving unit 520, the data driving unit 530, and the power unit 540, respectively.

Although it is illustrated in FIG. 5 that the scan driving unit 520, the data driving unit 530, the power unit 540, and the timing control unit 550 are separately implemented, the scan driving unit 520, the data driving unit 530, the power unit 540, and the timing control unit 550 may be combined. Thus, the scan driving unit 520, the data driving unit 530, the power unit 540, and the timing control unit 550 may be interpreted as functions of at least one peripheral circuit coupled to the display panel 510. For example, the timing control unit 550 may perform operations of the scan driving unit 520, the data driving unit 530, the power unit 540, or may include at least one component for performing operations of the scan driving unit 520, the data driving unit 530, the power unit 540.

A unit pixel may have a rhombus structure. A plurality of unit pixels may be arranged on the display panel 510. The unit pixel may include a first sub-pixel that emits a first color light, a second sub-pixel that emits a second color light, a third sub-pixel that emits a third color light, and a fourth sub-pixel that emits a fourth color light. The first color light, the second color light, and the third color light may correspond to one of a red color light, a green color light, and a blue color light, respectively. The fourth color light may correspond to a white color light. Further, in example embodiments, one side of the unit pixel may face one side of a neighboring unit pixel, where the neighboring unit pixel is apart from the unit pixel. Compared to a rectangular-shaped unit, the rhombus unit pixel may provide substantially equal distances between the sub-pixels that emit different color lights, for example, based on the orientation of the unit pixel, a diamond-type orientation may be more advantageous than a square-type orientation.

The first sub-pixel may have a square-shape or a vertically long rectangular-shape. In addition, the first sub-pixel may be arranged with respect to the center part of the unit pixel. The first sub-pixel may overlap the center part of the pixel. The other sub-pixels may be spaced away from the center part of the pixel.

The second sub-pixel and the third sub-pixel may have a vertically long hexagonal-shape. The second sub-pixel and the third sub-pixel may be symmetrically arranged on a left side and a right side with respect to the center part of the first sub-pixel, respectively. Further, the first sub-pixel, the second sub-pixel, and the third sub-pixel may be apart from each other. The fourth sub-pixel may have a pentagonal-shape. In addition, the fourth sub-pixel may be arranged on a lower side of the first sub-pixel and may be apart from the first sub-pixel, the second sub-pixel, and the third sub-pixel, for example, in a manner described herein.

The unit pixel may provide substantially equal distances between the first sub-pixel, the second sub-pixel, the third sub-pixel, and the fourth sub-pixel. Further, a distance between the first sub-pixel and the fourth sub-pixel may be substantially equal to a distance between the fourth sub-pixel and a third sub-pixel of a neighboring unit pixel that is arranged on a left side of the fourth sub-pixel, and a distance between the fourth sub-pixel and a second sub-pixel of a neighboring unit pixel that is arranged on a right side of the fourth sub-pixel, for example, in a manner described herein.

As a result, the unit pixel may enable a high resolution of the organic light emitting display device 500. Further, the organic light emitting display device 500 may display high-quality images because the organic light emitting display device 500 can improve color reproduction performance, brightness, and luminance by controlling luminance gray scale of a white color light emitted by a fourth sub-pixel (i.e., a white color sub-pixel).

Figure 6:
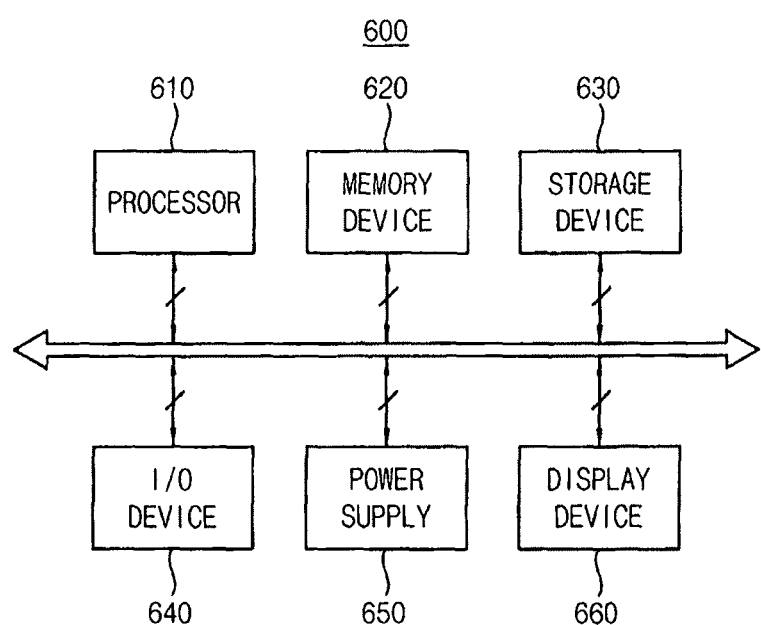
FIG. 6 is a block diagram illustrating an electronic device having an organic light emitting display device of FIG. 5.

FIG. 6 illustrates a block diagram of an electronic device having an organic light emitting display device of FIG. 5.

Referring to FIG. 6, the electronic device 600 may include a processor 610, a memory device 620, a storage device 630, an input/output (I/O) device 640, a power supply 650, and an organic light emitting display device 660. Here, the organic light emitting display device 660 may correspond to the organic light emitting display device 500 of FIG. 5. In addition, the electronic device 600 may further include a plurality of ports for communicating a video card, a sound card, a memory card, a universal serial bus (USB) device, other electronic devices, and the like.

The processor 610 may perform various computing functions. The processor 610 may be a micro-processor, a central processing unit (CPU), and the like. The processor 610 may be coupled to other components via an address bus, a control bus, a data bus, and the like. In some example embodiments, the processor 610 may be coupled to an extended bus such as a peripheral component interconnection (PCI) bus. The memory device 620 may store data for operations of the electronic device 600. For example, the memory device 620 may include a volatile semiconductor memory device such as a dynamic random access memory (DRAM) device, a static random access memory (SRAM) device, a mobile DRAM device, and the like, and/or a non-volatile semiconductor memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, and the like. In some example embodiments, the storage device 630 may correspond to an SSD device, an HDD device, a CD-ROM device, and the like. The storage device 630 may include a solid state drive (SSD), a hard disk drive (HDD), a CD-ROM, and the like.

The I/O device 640 may include an input device such as a keyboard, a keypad, a touch-pad, a touch-screen, a mouse, and the like, and an output device such as a speaker, a printer, and the like. In some example embodiments, the organic light emitting display device 660 may be included in the I/O device 640. The power supply 650 may provide a power for operations of the electronic device 600. The organic light emitting display device 660 may be coupled to other components via the buses or other communication links. As described above, the organic light emitting display device 660 may include a display panel, a scan driving unit, a data driving unit, a power unit, and a timing control unit. Specifically, the organic light emitting display device 660 may include the display panel including a plurality of unit pixels. The unit pixel may include a first sub-pixel that emits a first color light, a second sub-pixel that emits a second color light, a third sub-pixel that emits a third color light, and a fourth sub-pixel that emits a fourth color light. In example embodiments, the first color light, the second color light, and the third color light may correspond to one of a red color light, a green color light, and a blue color light, respectively. The fourth color light may correspond to a white color light. Additionally, the unit pixel may have a rhombus structure. As a result, the unit pixel may enable a high resolution of the organic light emitting display device without any increase of a size of the unit pixel by including a rhombus structure that has substantially equal distances between sub-pixels emitting different color lights. Further, luminance gray scale of the white color light emitted by the fourth sub-pixel may be controlled by a driving integrated circuit of an organic light emitting display device 660. Therefore, the organic light emitting display device 660 may provide high-quality images. Thus, the organic light emitting display device 660 including the unit pixels may have improved display ability (e.g., brightness, luminance, resolution, and the like).

The present embodiments may be applied to a display device and an electronic device having the display device. For example, the present embodiments may be applied to a television, a digital television, a mobile phone, a smart phone, a laptop computer, a tablet computer, a personal digital assistants (PDA), a portable multimedia player (PMP), a digital camera, a music player, a portable game console, a navigation device, and the like.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the disclosure as set forth in the following claims.

What is claimed is:

1. A unit pixel, comprising:
a first sub-pixel configured to emit a first color light;
a second sub-pixel configured to emit a second color light;
a third sub-pixel configured to emit a third color light; and
a fourth sub-pixel configured to emit a fourth color light,
wherein the first sub-pixel, the second sub-pixel, the third sub-pixel, and the fourth sub-pixel are arranged in the unit pixel having a rhombus shape,
wherein the first color light corresponds to one of a red color light, a green color light, and a blue color light,
wherein the second color light corresponds to one of the red color light, the green color light, and the blue color light,
wherein the third color light correspond to one of the red color light, the green color light, and the blue color light,
wherein the fourth color light corresponds to a white color light,
wherein colors of the first to third color lights are different from each other,
wherein the first sub-pixel has a quadrilateral-shape,
wherein the second sub-pixel and the third sub-pixel have a hexagonal-shape,
wherein the fourth sub-pixel has a pentagonal-shape, and
wherein the second sub-pixel and the third sub-pixel are symmetrically arranged on a left side and a right side with respect to a center part of the first sub-pixel, respectively.

2. The unit pixel as claimed in claim 1, wherein one side of the unit pixel faces one side of a neighboring unit pixel, the neighboring unit pixel being apart from the unit pixel.

3. The unit pixel as claimed in claim 2, wherein the first sub-pixel has a square-shape or a vertically long rectangular-shape, and the first sub-pixel is arranged on a center part of the unit pixel.

4. The unit pixel as claimed in claim 2, wherein the second sub-pixel and the third sub-pixel have a vertically long hexagonal-shape, and the first sub-pixel, the second sub-pixel, and the third sub-pixel are apart from each other.

5. The unit pixel as claimed in claim 2, wherein the fourth sub-pixel is arranged on a lower side of the first sub-pixel, and the fourth sub-pixel is apart from the first sub-pixel, the second sub-pixel, and the third sub-pixel.

6. The unit pixel as claimed in claim 1, wherein an area of the fourth sub-pixel is between about 50% and about 100% of an area of the first sub-pixel.

7. The unit pixel as claimed in claim 6, wherein a distance between the first sub-pixel and the fourth sub-pixel is substantially equal to a distance between the first sub-pixel and the second sub-pixel, and a distance between the first sub-pixel and the third sub-pixel.

8. The unit pixel as claimed in claim 6, wherein a distance between the first sub-pixel and the fourth sub-pixel is substantially equal to a distance between the fourth sub-pixel and the second sub-pixel, and a distance between the fourth sub-pixel and the third sub-pixel.

9. The unit pixel as claimed in claim 6, wherein a distance between the first sub-pixel and the fourth sub-pixel is substantially equal to a distance between the fourth sub-pixel and a third sub-pixel of a neighboring unit pixel that is arranged on a left side of the fourth sub-pixel, and a distance between the fourth sub-pixel and a second sub-pixel of a neighboring unit pixel that is arranged on a right side of the fourth sub-pixel.

10. An organic light emitting display device including a display panel having a plurality of unit pixels, a scan driving unit, a data driving unit, and a timing control unit, each of the unit pixels comprising:
   a first sub-pixel configured to emit a first color light;
   a second sub-pixel configured to emit a second color light;
   a third sub-pixel configured to emit a third color light; and
   a fourth sub-pixel configured to emit a fourth color light,
   wherein the first sub-pixel, the second sub-pixel, the third sub-pixel, and the fourth sub-pixel are arranged in each of the unit pixels, each unit pixel having a rhombus shape,
   wherein the first color light corresponds to one of a red color light, a green color light, and a blue color light,
   wherein the second color light corresponds to one of the red color light, the green color light, and the blue color light,
   wherein the third color light correspond to one of the red color light, the green color light, and the blue color light,
   wherein the fourth color light corresponds to a white color light,
   wherein colors of the first to third color lights are different from each other,
   wherein the first sub-pixel has a quadrilateral-shape,
   wherein the second sub-pixel and the third sub-pixel have a hexagonal-shape,
   wherein the fourth sub-pixel has a pentagonal-shape, and
   wherein the second sub-pixel and the third sub-pixel are symmetrically arranged on a left side and a right side with respect to a center part of the first sub-pixel, respectively.

11. The device as claimed in claim 10, wherein one side of the unit pixel faces one side of a neighboring unit pixel, the neighboring unit pixel being apart from the unit pixel.

12. The device as claimed in claim 11, wherein the first sub-pixel has a square-shape or a vertically long rectangular-shape, and the first sub-pixel is arranged on a center part of the unit pixel.

13. The device as claimed in claim 11, wherein the second sub-pixel and the third sub-pixel have a vertically long hexagonal-shape, and the first sub-pixel, the second sub-pixel, and the third sub-pixel are apart from each other.

14. The device as claimed in claim 11, wherein the fourth sub-pixel is arranged on a lower side of the first sub-pixel, and the fourth sub-pixel is apart from the first sub-pixel, the second sub-pixel, and the third sub-pixel.

15. The device as claimed in claim 10, wherein the distance between the first sub-pixel and the fourth sub-pixel is substantially equal to a distance between the first sub-pixel and the second sub-pixel, and a distance between the first sub-pixel and the third sub-pixel.

16. The device as claimed in claim 15, wherein a distance between the first sub-pixel and the fourth sub-pixel is substantially equal to a distance between the fourth sub-pixel and the second sub-pixel, and a distance between the fourth sub-pixel and the third sub-pixel.

17. The device as claimed in claim 15, wherein a distance between the first sub-pixel and the fourth sub-pixel is substantially equal to a distance between the fourth sub-pixel and a third sub-pixel of a neighboring unit pixel that is arranged on a left side of the fourth sub-pixel, and a distance between the fourth sub-pixel and a second sub-pixel of a neighboring unit pixel that is arranged on a right side of the fourth sub-pixel.

* * * * *